US008612687B2

(12) United States Patent
Li et al.

(10) Patent No.: US 8,612,687 B2
(45) Date of Patent: Dec. 17, 2013

(54) LATENCY-TOLERANT 3D ON-CHIP MEMORY ORGANIZATION

(75) Inventors: Jian Li, Austin, TX (US); William E. Speight, Austin, TX (US); Lixin Zhang, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 640 days.

(21) Appl. No.: 12/787,895

(22) Filed: May 26, 2010

(65) Prior Publication Data

US 2011/0296107 A1 Dec. 1, 2011

(51) Int. Cl.
*H01L 29/00* (2006.01)
*H01L 21/00* (2006.01)
*G06F 12/00* (2006.01)

(52) U.S. Cl.
USPC ............ 711/118; 711/117; 711/119; 711/122

(58) Field of Classification Search
USPC .................................. 711/117, 118, 119, 122
See application file for complete search history.

(56) References Cited

U.S. PATENT DOCUMENTS

| 6,711,043 | B2 | 3/2004 | Friedman et al. | |
| 6,765,813 | B2 | 7/2004 | Scheuerlein et al. | |
| 7,447,831 | B2 | 11/2008 | Dreps et al. | |
| 7,627,721 | B2 | 12/2009 | Hass | |
| 2004/0225849 | A1* | 11/2004 | Wolczko et al. | 711/165 |
| 2007/0180041 | A1* | 8/2007 | Suzuoki | 709/207 |
| 2008/0320277 | A1 | 12/2008 | Fish, III | |
| 2009/0070721 | A1 | 3/2009 | Solomon | |
| 2009/0070727 | A1 | 3/2009 | Solomon | |
| 2009/0103345 | A1 | 4/2009 | McLaren et al. | |
| 2010/0115204 | A1 | 5/2010 | Li et al. | |
| 2011/0264858 | A1* | 10/2011 | Jeddeloh et al. | 711/114 |

* cited by examiner

*Primary Examiner* — Manorama Padmanabhan
*Assistant Examiner* — Mehdi Namazi
(74) *Attorney, Agent, or Firm* — Stephen R. Tkacs; Stephen J. Walder, Jr.; Eustus D. Nelson

(57) ABSTRACT

A mechanism is provided within a 3D stacked memory organization to spread or stripe cache lines across multiple layers. In an example organization, a 128B cache line takes eight cycles on a 16B-wide bus. Each layer may provide 32B. The first layer uses the first two of the eight transfer cycles to send the first 32B. The next layer sends the next 32B using the next two cycles of the eight transfer cycles, and so forth. The mechanism provides a uniform memory access.

17 Claims, 4 Drawing Sheets

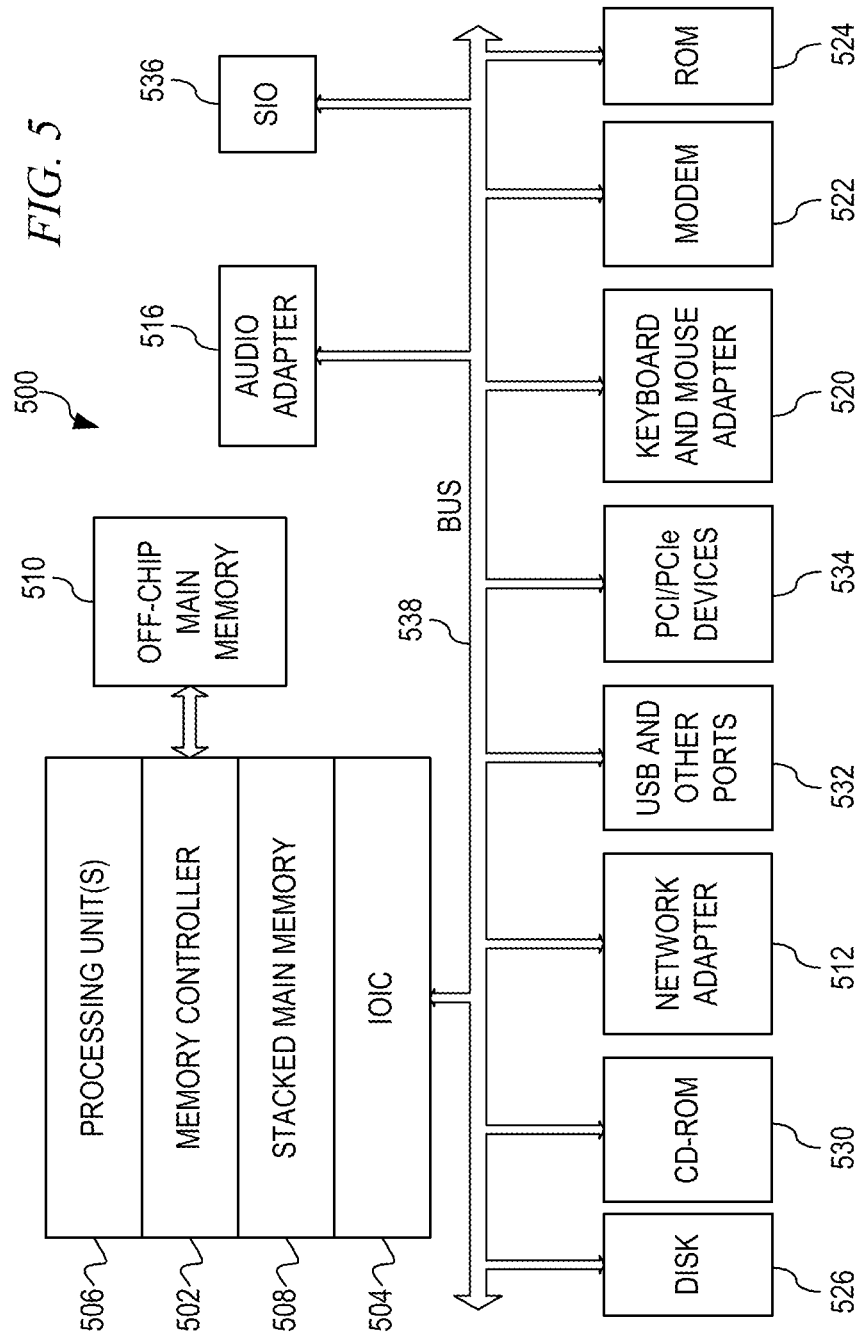

LATENCY-TOLERANT 3D ON-CHIP MEMORY ORGANIZATION

BACKGROUND

The present application relates generally to an improved data processing apparatus and method and more specifically to mechanisms for latency-tolerant three-dimensional on-chip memory organization.

Three dimensional (3D) chip stacking technology allows multiple layers of dynamic random access memory (DRAM) to be integrated into a processor chip. In 3D chip stacking, the fabrication process includes stacking integrated circuits (ICs) with through silicon vias (TSVs) for communication between layers.

Due to physical limitations and constraints, different DRAM layers may have different access latency from the logic layer. Most modern microprocessors support cache lines much wider than the on-chip data bus. For instance, a Power7™ processor data bus width is 16 bytes while its cache line size is 128 bytes. Traditional memory organization uses multiple cycles to read a cache line from a set of DRAM banks with the same distance.

SUMMARY

In one illustrative embodiment, a method, in a data processing system, is provided for latency-tolerant memory access in a three-dimensional stacked memory. The method comprises receiving, by a memory controller, a memory access command from another unit. The method further comprises sending, by the memory controller, a memory access command to each of a plurality of memory layers in the three-dimensional stacked memory. The method further comprises receiving, by the memory controller, a portion of a cache line from each memory layer within the plurality of memory layers to form a cache line. The method further comprises returning, by the memory controller, the cache line to the requesting unit.

In other illustrative embodiments, a computer program product comprising a computer useable or readable medium having a computer readable program is provided. The computer readable program, when executed on a computing device, causes the computing device to perform various ones, and combinations of, the operations outlined above with regard to the method illustrative embodiment.

In yet another illustrative embodiment, an apparatus is provided. The apparatus may comprise one or more processors and a memory coupled to the one or more processors. The memory may comprise instructions which, when executed by the one or more processors, cause the one or more processors to perform various ones, and combinations of, the operations outlined above with regard to the method illustrative embodiment.

In another illustrative embodiment, a processing unit with three-dimensional stacked memory comprises a logic layer comprising at least one processing core, at least one cache, and at least one memory controller, and a plurality of memory layers. A memory controller within the processing unit receives a memory access command from another unit within the processing core, sends a memory access command to each of the plurality of memory layers, receives a portion of a cache line from each memory layer within the plurality of memory layers to form a cache line, and returns the cache line to the requesting unit.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 5 is a block diagram of an example data processing system in which aspects of the illustrative embodiments may be implemented.

DETAILED DESCRIPTION

The illustrative embodiments provide a mechanism for latency-tolerant three-dimensional on-chip memory organization. The mechanism leverages the fact that each memory layer is one cycle away from the next memory layer in the direction of the logic layer. Instead of receiving a cache line from one memory layer, the mechanism of the illustrative embodiments receives a cache line from multiple memory layers.

Figure 1A:
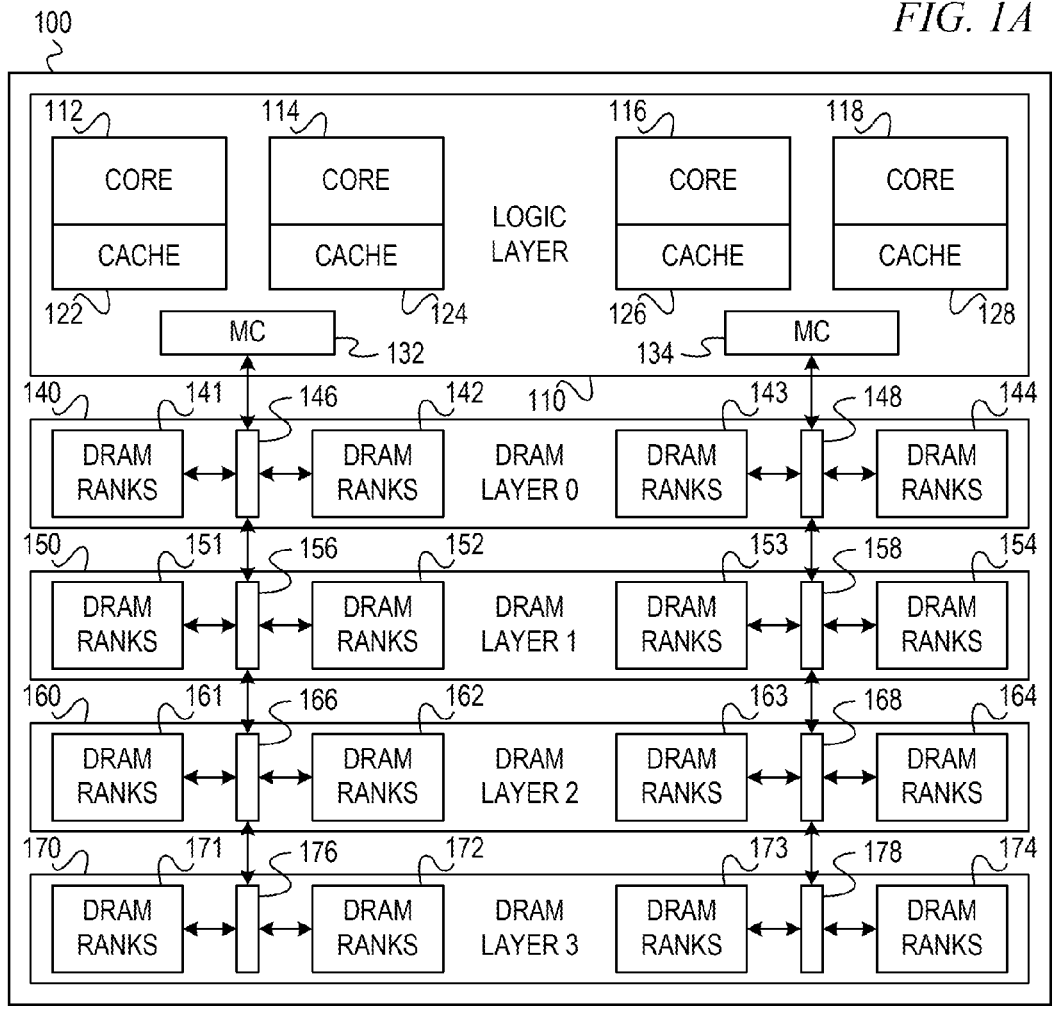
FIG. 1A is a block diagram illustrating a three-dimensional processing unit with on-chip memory in accordance with one illustrative embodiment.

FIG. 1A is a block diagram illustrating a three-dimensional processing unit with on-chip memory in accordance with one illustrative embodiment. Processing unit chip 100 comprises logic layer 110, dynamic random access memory (DRAM) layer 0 140, DRAM layer 1 150, DRAM layer 2 160, and DRAM layer 3 170. The depicted example comprises one logic layer and four DRAM layers; however, the number of layers may vary depending upon the implementation. For example, the processing unit chip 100 may comprise more than one logic layer or may comprise more or fewer memory layers.

Logic layer 110 comprises a plurality of cores and respective caches including cores 112, 114, 116, 118 and caches 122, 124, 126, 128. The logic layer 110 may comprise more or fewer cores or caches depending upon the implementation. Logic layer also comprises memory controllers 132, 134. Again, the logic layer may comprise more or fewer memory controllers depending upon the implementation.

DRAM layer 0 140 comprises a plurality of DRAM ranks 141, 142, 143, 144. Similarly, DRAM layer 1 150 comprises a plurality of DRAM ranks 151, 152, 153, 154; DRAM layer 2 160 comprises a plurality of DRAM ranks 161, 162, 163, 164; and, DRAM layer 3 170 comprises a plurality of DRAM ranks 171, 172, 173, 174. Each DRAM rank is connected to a DRAM interface unit. A DRAM interface unit in a DRAM layer relays DRAM commands and write data from the upper layer to the DRAM ranks on the same layer and/or to the lower DRAM layer, and relays read data from the DRAM ranks on the same layer and/or the lower DRAM layer to the upper layer. In one embodiment, a DRAM interface unit has 1 cycle latency for all commands and data traffic. In another embodiment, a DRAM interface has 1 cycle latency for relaying commands and data for another layer but 0 cycle latency for passing commands and data to DRAM ranks within the same layer. Memory controller 132 accesses memory ranks 141 and 142 through DRAM interface unit 146, accesses memory ranks 151 and 152 through DRAM interface unit 146 and 156, accesses memory ranks 161 and 162 through DRAM interface unit 146, 156, and 166, and accesses memory ranks 171 and 172 through DRAM interface unit 146, 156, 166, and 176. Memory controller 134 accesses memory ranks 143 and 144 through DRAM interface unit 148, accesses memory ranks 153 and 154 through DRAM interface unit 148 and 158, accesses memory ranks 163 and 164 through DRAM interface unit 148, 158, and 168, and accesses memory ranks 173 and 174 through DRAM interface unit 148, 158, 168, and 178.

Figure 1B:
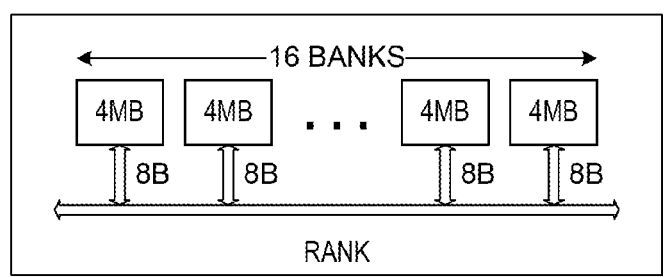
FIG. 1B is a block diagram illustrating a memory rank in accordance with one illustrative embodiment.

FIG. 1B is a block diagram illustrating a memory rank in accordance with one illustrative embodiment. In the depicted example, a memory rank comprises 16 banks of memory, each bank being 4MB. The memory controller reads 8B from each bank; therefore, the memory controller may read 128B from each rank. However, in one example, a processor has a 16B bus. Therefore, reading a 128B cache line takes a minimum of 8 cycles plus latency.

As an example, core 112 may perform a memory access. If cache 122 determines that the data is not found in cache 122 (i.e., a cache miss), then the memory access goes to memory controller 132, for example. Memory controller 132 then reads the cache line from one of DRAM layers 140, 150, 160, or 170.

In a traditional memory organization, the memory controller accesses an array of chips in the same distance for one cache line. This results in uniform access within each array. This access takes a minimum of 8 cycles plus latency. However, because the arrays of chips are in different layers, the latency is not uniform throughout a 3D architecture, as shown in FIG. 1A. For instance, if memory controller 132 reads a cache line from DRAM layer 3 170, the latency will be greater than a read of a cache line from DRAM layer 0 140. The difference in latency could be 3 cycles or more.

3D stacked memory leads to different layers having different access latency. 3D stacked memory could reduce memory access latency by up to two-thirds over off-chip memory. Small improvements in latency thus would significantly improve the overall operation of a 3D stacked memory or 3D stacked processing unit with multiple memory layers. Organizations with shorter latency would greatly improve the practicality of 3D stacked architectures.

Figure 2:
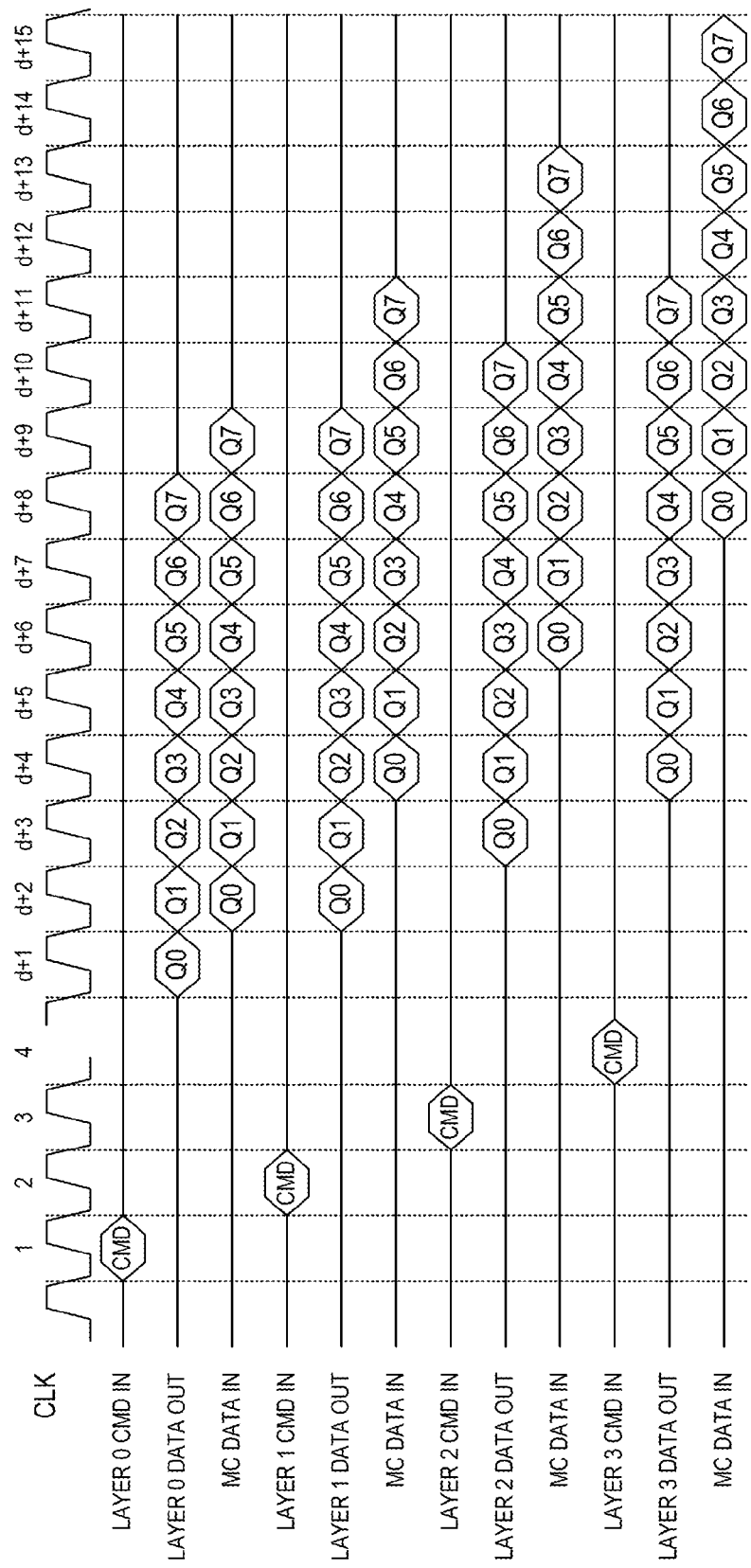
FIG. 2 is a timing diagram for memory access in a three-dimensional stacked memory in accordance with an example embodiment.

FIG. 2 is a timing diagram for memory access in a three-dimensional stacked memory in accordance with an example embodiment. The memory controller sends a read command that arrives at layer 0 memory in a first cycle, at layer 1 memory in a second cycle, at layer 2 memory in a third cycle, and at layer 3 memory in a fourth cycle. Then, after some delay, d, at cycle d+1 layer 0 memory begins to provide data out. The value of the delay, d, is the total amount of time from when the command was first sent to the time the data was provided by layer 0 memory.

The memory controller begins to receive the data in at d+2, because the memory controller is in the logic layer, which is one cycle away from layer 0 memory. The memory controller receives data in quad-words (Q). Therefore, the memory controller receives quad-word Q0 at d+2, Q1 at d+3, and so on. The memory controller receives the last quad-word Q7 and finishes reading the entire cache line at d+9.

Layer 1 memory is two cycles away from the logic layer; therefore, layer 1 memory begins to provide data out at d+2. The memory controller receives the data in at d+4, because the memory controller is in the logic layer, which is two cycles away from layer 1 memory. The memory controller receives quad-word Q0 at d+4, Q1 at d+5, and so on. The memory controller receives the last quad-word Q7 and finishes reading the entire cache line at d+11.

Layer 2 memory is three cycles away from the logic layer; therefore, layer 2 memory begins to provide data out at d+3. The memory controller begins to receive the data in at d+6, because the memory controller is in the logic layer, which is three cycles away from layer 2 memory. The memory controller receives quad-word Q0 at d+6, Q1 at d+7, and so on. The memory controller receives the last quad-word Q7 and finishes reading the entire cache line at d+13.

Layer 3 memory is four cycles away from the logic layer; therefore, layer 3 memory begins to provide data out at d+4. The memory controller receives the data in at d+8, because the memory controller is in the logic layer, which is four cycles away from layer 3 memory. The memory controller receives quad-word Q0 at d+8, Q1 at d+9, and so on. The memory controller receives the last quad-word Q7 and finishes reading the entire cache line at d+15.

Therefore, the best case scenario is reading from layer 0 memory where the memory controller reads a cache line in d+9 cycles, where d is a number of delay cycles. The worst case scenario is reading a cache line from the farthest layer in the three-dimensional stacked memory, where the memory controller reads a cache line in d+15 cycles. In this organization, reads are uniform within a layer, but not uniform throughout the 3D stacked memory.

In accordance with an illustrative embodiment, a mechanism is provided within a 3D stacked memory organization to spread or stripe cache lines across multiple layers. In an example organization, a 128B cache line takes eight cycles on a 16B-wide bus. Each layer may provide 32B. The first layer uses the first two of the eight transfer cycles to send the first 32B. The next layer sends the next 32B using the next two cycles of the eight transfer cycles, and so forth.

Using the mechanism of this illustrative embodiment, the memory controller does not have multiple memory layers to manage. The mechanism results in a uniform memory access for all memory accesses. The mechanism reduces the average latency by three cycles, which is approximately 10% reduction in average memory latency. The mechanism applies similarly to write operations.

Figure 3:
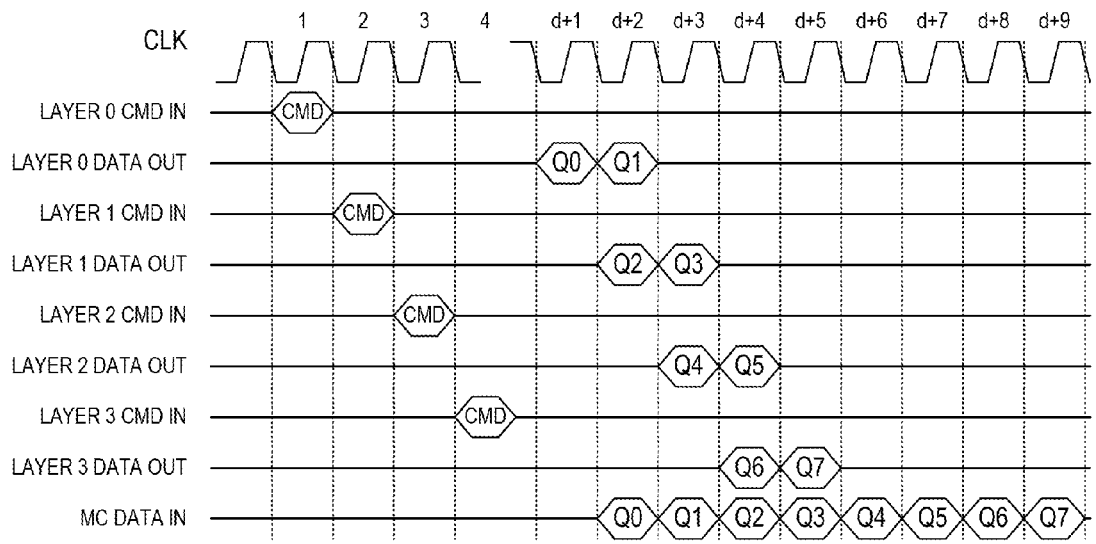
FIG. 3 is a timing diagram for memory access in a three-dimensional stacked memory in accordance with an example embodiment.

FIG. 3 is a timing diagram for latency-tolerant memory access in a three-dimensional stacked memory in accordance with an example embodiment. The memory controller sends a read command that arrives at layer 0 memory in the first cycle, at layer 1 memory in the second cycle, at layer 2 memory in the third cycle, and at layer 3 memory in the fourth cycle. Then, after some delay, d, layer 0 memory begins to provide data out. The value of the delay, d, is the total amount of time from when the command was first sent to the time the data was provided by layer 0 memory. In each layer, the command in to data out delay is d cycles. All four layers work together to provide eight beats of data.

Layer 0 memory provides two quad words, Q0 and Q1. Layer 1 memory receives the command a cycle later and begins to provide quad words Q2 and Q3 at d+2. Layer 2 memory receives the command and begins to provide quad words Q4 and Q5 at d+3. Layer 3 memory receives the command and begins to provide quad words Q6 and Q7 at d+4.

Because layer 0 memory is one cycle away from the memory controller in the logic layer, the memory controller begins to receive data from layer 0 memory at d+2. Thus, the memory controller receives Q0 at d+2 and Q1 at d+3. Because layer 1 memory is two cycles away from the logic layer, the memory controller receives Q2 at d+4 and Q3 at d+5. Similarly, the memory controller receives Q4 from layer 2 memory at d+6, receives Q5 from layer 2 memory at d+7, receives Q6 from layer 3 memory at d+8, and receives Q7 from layer 3 memory at d+9. The memory controller finishes receiving the entire cache line in d+9 cycles, which is equivalent to the best case scenario described above with respect to FIG. 2.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be for example, but not limited to, an electronic, magnetic, optical, electromagnetic, infrared, or semiconductor system, apparatus, device, or any suitable combination of the foregoing. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

Figure 4:
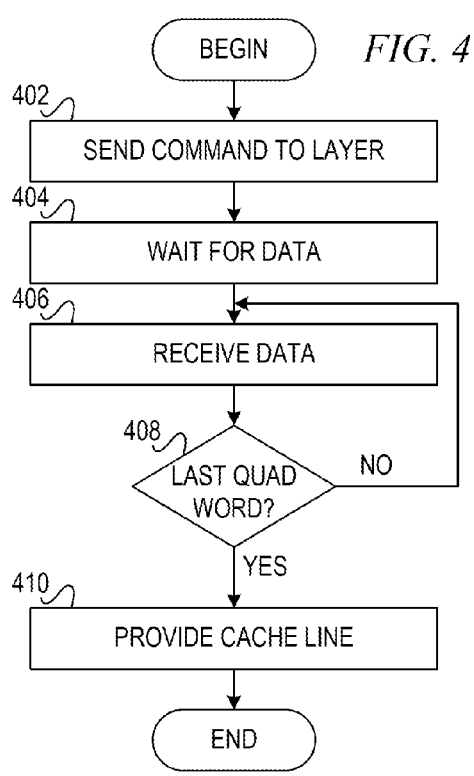
FIG. 4 is a flowchart illustrating operation of a mechanism for latency-tolerant memory access in a three-dimensional stacked memory in accordance with an illustrative embodiment.

FIG. 4 is a flowchart illustrating operation of a mechanism for latency-tolerant memory access in a three-dimensional stacked memory in accordance with an illustrative embodiment. Operation begins, and the memory controller sends a command to a closest memory layer (block 402). The memory controller then waits for data (block 404).

After some delay, the memory controller receives data from the first memory layer (block 406). The memory controller may receive data in multiple cycles in block 406. For example, the memory controller may receive a first quad-word in one cycle and a second quad-word in a subsequent cycle. The memory controller then determines whether it has received the last quad-word from the last layer in the three-dimensional stacked memory (block 408). If it has not received the last quad-word, then operation returns to block 406 to receive more data.

If the memory controller determines that it has received the last quad-word from the last layer in the three-dimensional stacked memory in block 408, then the memory controller provides the cache line to the cache (block 410). The operation then ends. In another embodiment, quad-words can also be sent in a pipelined fashion to the requesting cache, without memory controller waiting for the last quad-word to arrive in a store-and-forward fashion.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The illustrative embodiments may be utilized in many different types of data processing environments including a distributed data processing environment, a single data processing device, or the like. In order to provide a context for the description of the specific elements and functionality of the illustrative embodiments, FIG. 5 is provided hereafter as an example environment in which aspects of the illustrative embodiments may be implemented. While the description following FIG. 5 will focus primarily on a single data processing device implementation, this is only an example and is not intended to state or imply any limitation with regard to the features of the present invention. To the contrary, the illustrative embodiments are intended to include distributed data processing environments.

FIG. 5 is a block diagram of an example data processing system in which aspects of the illustrative embodiments may be implemented. Data processing system 500 is an example of a computer in which computer usable code or instructions may be located. In the depicted example, data processing system 500 employs a 3D chip architecture including processing unit(s) 506, on-chip memory controller(s) 502, stacked main memory 508, on-chip input/output and interconnect controller (IOIC) 504, and external main memory 510.

Processing unit(s) 506 may be processing cores 112, 114, 116, 118 in FIG. 1A, for example. On-chip main memory 508 and off-chip main memory 510 may be a shared memory that is shared among a plurality of processing units. That is, on-chip main memory 508 and off-chip main memory 510 may be a higher level of memory that supplements the memory in each processing unit 506.

In the depicted example, local area network (LAN) adapter 512 connects to IOIC 504 through bus 538. Audio adapter 516, keyboard and mouse adapter 520, modem 522, read only memory (ROM) 524, hard disk drive (HDD) 526, CD-ROM drive 530, universal serial bus (USB) ports and other communication ports 532, and PCI/PCIe devices 534 connect to IOIC 504 through bus 538. PCI/PCIe devices may include, for example, Ethernet adapters, add-in cards, and PC cards for notebook computers. PCI uses a card bus controller, while PCIe does not. ROM 524 may be, for example, a flash basic input/output system (BIOS).

HDD 526 and CD-ROM drive 530 connect to IOIC 504 through bus 538. HDD 526 and CD-ROM drive 530 may use, for example, an integrated drive electronics (IDE) or serial advanced technology attachment (SATA) interface. Super I/O (SIO) device 536 may be connected to IOIC 504.

An operating system runs on processing unit 506. The operating system coordinates and provides control of various components within the data processing system 500 in FIG. 5. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 500 (Java is a trademark of Sun Microsystems, Inc. in the United States, other countries, or both).

As a server, data processing system 500 may be, for example, an IBM® eServer™ System p® running the Advanced Interactive Executive (AIX®) operating system or the LINUX® operating system (eServer, System p, and AIX are trademarks of International Business Machines Corporation in the United States, other countries, or both while LINUX is a trademark of Linus Torvalds in the United States, other countries, or both). Data processing system 500 may be a symmetric multiprocessor (SMP) system including a plurality of processors in processing unit 506. Alternatively, a single processor system may be employed.

Instructions for the operating system, the object-oriented programming system, and applications or programs are located on storage devices, such as HOD 526, and may be loaded into main memory 508 for execution by processing unit 506. The processes for illustrative embodiments of the present invention may be performed by processing unit 506 using computer usable program code, which may be located in a memory such as, for example, on-chip main memory 508, off-chip main memory 510, ROM 524, or in one or more peripheral devices 526 and 530, for example.

A bus system, such as bus 538 as shown in FIG. 5, may be comprised of one or more buses. Of course, the bus system may be implemented using any type of communication fabric or architecture that provides for a transfer of data between different components or devices attached to the fabric or architecture. A communication unit, such as modem 522 or network adapter 512 of FIG. 5, may include one or more devices used to transmit and receive data. A memory may be, for example, on-chip main memory 508, off-chip main memory 510, ROM 524, or a cache such as found in on-chip memory controller 502 in FIG. 5.

Those of ordinary skill in the art will appreciate that the hardware in FIG. 5 may vary depending on the implementation. Other internal hardware or peripheral devices, such as flash memory, equivalent non-volatile memory, or optical disk drives and the like, may be used in addition to or in place of the hardware depicted in FIG. 5. Also, the processes of the illustrative embodiments may be applied to a multiprocessor data processing system, other than the SMP system mentioned previously, without departing from the spirit and scope of the present invention.

Moreover, the data processing system 500 may take the form of any of a number of different data processing systems including client computing devices, server computing devices, a tablet computer, laptop computer, telephone or other communication device, a personal digital assistant (PDA), or the like. In some illustrative examples, data processing system 500 may be a portable computing device which is configured with flash memory to provide non-volatile memory for storing operating system files and/or usergenerated data, for example. Essentially, data processing system 500 may be any known or later developed data processing system without architectural limitation.

Thus, the illustrative embodiments provide a mechanism within a 3D stacked memory organization to spread or stripe cache lines across multiple layers. In an example organization, a 128B cache line takes eight cycles on a 16B-wide bus. Each layer may provide 32B. The first layer uses the first two of the eight transfer cycles to send the first 32B. The next layer sends the next 32B using the next two cycles of the eight transfer cycles, and so forth. Using the mechanism of this illustrative embodiment, the memory controller does not have multiple memory layers to manage. The mechanism results in a uniform memory access of eight cycles for all memory accesses. The mechanism reduces the average latency by three cycles, which is approximately 10% reduction in average memory latency.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for latency-tolerant memory access in a three-dimensional stacked memory, the method comprising:
   receiving, by a memory controller, a memory access command from a processing core;
   sending, by the memory controller, a memory access command to each of a plurality of memory layers in the three-dimensional stacked memory, wherein sending the memory access command to each of the plurality of memory layers in the three-dimensional stacked memory comprises sending by the memory controller a first command to a first memo layer in a first cycle, relaying the first command by the first memory layer to a second memory layer in a second cycle, relaying the first command by the second memory layer to a third memory layer in a third cycle, and relaying the first command by the third memory layer to a fourth memory layer in a fourth cycle;
   receiving, by the memory controller, a portion of a cache line from each memory layer within the plurality of memory layers to form a cache line; and
   returning, by the memory controller, the cache line to the requesting processor core.

2. The method of claim 1, wherein the memory controller is in a logic layer, wherein the first memory layer is closer to the logic layer than the second memory layer, wherein the second memory layer is closer to the logic layer than the third memory layer, and wherein the third memory layer is closer to the logic layer than the fourth memory layer.

3. The method of claim 2, wherein the first memory layer begins sending a first portion of data in a number of delay cycles;
   wherein the second memory layer begins sending a second portion of data in the number of delay cycles plus one cycle;
   wherein the third memory layer begins sending a third portion of data in the number of delay cycles plus two cycles; and
   wherein the fourth memory layer begins sending a form a portion data in the number of delay cycles plus three cycles.

4. The method of claim 3, wherein each of the first portion of data, the second portion of data, the third portion of data, and the fourth portion of data comprises two quad-words.

5. The method of claim 3, wherein receiving the portion of the cache line from each memory layer within the plurality of memory layers comprises:
   receiving, by the memory controller, the first portion of data in the number of delay cycles plus two cycles and the number of delay cycles plus three cycles;
   receiving, by the memory controller, the second portion of data in the number of delay cycles plus four cycles and the number of delay cycles plus five cycles;
   receiving, by the memory controller, the first portion of data in the number of delay cycles plus six cycles and the number of delay cycles plus seven cycles; and
   receiving, by the memory controller, the first portion of data in the number of delay cycles plus eight cycles and the number of delay cycles plus nine cycles.

6. The method of claim 1, wherein the processing core sends the memory access command to the memory controller responsive to a cache miss.

7. A computer program product comprising a computer readable storage medium having a computer readable program stored therein, wherein the computer readable program, when executed on a computing device, causes the computing device to:
   receive, by a memory controller, a memory access command from a processing core;
   send, by the memory controller, a memory access command to each of a plurality of memory layers in the three-dimensional stacked memory, wherein sending the memory access command to each of the plurality of memory layers in the three-dimensional stacked memory comprises sending by the memory controller a first command to a first memory layer in a first cycle, relaying the first command by the first memory layer to a second memory layer in a second cycle, relaying the first command by the second memory layer to a third memory layer in a third cycle, and relaying the first command by the third memory layer to a fourth memory layer in a fourth cycle;

receive, by the memory controller, a portion of a cache line from each memory layer within the plurality of memory layers to form a cache line; and return, by the memory controller, the cache line to the requesting processor core.

8. The computer program product of claim 7, wherein the memory controller is in a logic layer, wherein the first memory layer is closer to the logic layer than the second memory layer, wherein the second memory layer is closer to the logic layer than the third memory layer, and wherein the third memory layer is closer to the logic layer than the fourth memory layer.

9. The computer program product of claim 8, wherein the first memory layer begins sending a first portion of data in a number of delay cycles;

wherein the second memory layer begins sending a second portion of data in the number of delay cycles plus one cycle;

wherein the third memory layer begins sending a third portion of data in the number of delay cycles plus two cycles; and wherein the fourth memory layer begins sending a fourth portion of data in the number of delay cycles plus three cycles.

10. The computer program product of claim 9, wherein each of the first portion of data, the second portion of data, the third portion of data, and the fourth portion of data comprises two quad-words.

11. The computer program product of claim 9, wherein receiving the portion of the cache line from each memory layer within the plurality of memory layers comprises:

receiving, by the memory controller, the first portion of data in the number of delay cycles plus two cycle and the number of delay cycles plus three cycles;

receiving, by the memory controller, the second portion of data in the number of delay cycles plus four cycles and the number of delay cycles plus five cycles;

receiving, by the memory controller, the first portion of data in the number of delay cycles plus six cycles and the number of delay cycles plus seven cycles; and receiving, by the memory controller, the first portion of data in the number of delay cycles plus eight cycles and the number of delay cycles plus nine cycles.

12. The computer program product of claim 7, wherein the computer readable program is stored in a computer readable storage medium in a data processing system and wherein the computer readable program was downloaded over a network from a remote data processing system.

13. The computer program product of claim 7, wherein the computer readable program is stored in a computer readable storage medium in a server data processing system and wherein the computer readable program is downloaded over a network to a remote data processing system for use in a computer readable storage medium with the remote system.

14. A processing unit with three-dimensional stacked memory, comprising:

a logic layer comprising at least one processing core, at least one cache, and at least one memory controller; and a plurality of memory layers, wherein a memory controller within the at least one memory controller receives a memory access command from a processing core within the at least one processing core, sends a memory access command to each of the plurality of memory layers, receives a portion of a cache line from each memory layer within the plurality of memory layers to form a cache line, and returns the cache line to the requesting processor core, wherein sending the memory access command to each of a plurality of memory layers in the three-dimensional stacked memory comprises sending a first command to a first memory layer in a first cycle, relaying the first command by the first memory layer to a second memory layer in a cycle, relaying the first command by the second memory layer to a third memory layer in a third cycle, and relaying the first command by the third memory layer to a fourth memory layer in a fourth cycle.

15. The processing unit of claim 14, wherein the memory controller is in a logic layer, wherein the first memory layer is closer to the logic layer than the second memory layer, wherein the second memory layer is closer to the logic layer than the third memory layer, and wherein the third memory layer is closer to the logic layer than the fourth memory layer.

16. The processing unit of claim 15, wherein the first memory layer begins sending a first portion of data in a number of delay cycles;

wherein the second memory layer begins sending a second portion of data in the number of delay cycles plus one cycle;

wherein the third memory layer begins sending a third portion of data in the number of delay cycles plus two cycles; and wherein the fourth memory layer begins sending a fourth portion of data in the number of delay cycles plus three cycles.

17. The processing unit of claim 16, wherein receiving the portion of the cache line from each memory layer within the plurality of memory layers comprises:

receiving, by the memory controller, the first portion of data in the number of delay cycles plus two cycle and the number of delay cycles plus three cycles;

receiving, by the memory controller, the second portion of data in the number of delay cycles plus four cycles and the number of delay cycles plus five cycles;

receiving, by the memory controller, the first portion of data in the number of delay cycles plus six cycles and the number of delay cycles plus seven cycles; and receiving, by the memory controller, the first portion of data in the number of delay cycles plus eight cycles and the number of delay cycles plus nine cycles.

\* \* \* \* \*